United States Patent [19]
Hanna

[11] Patent Number: 5,978,883
[45] Date of Patent: Nov. 2, 1999

[54] BLOCK INTERLEAVING AND DEINTERLEAVING METHOD AND DEVICE THEREFOR

[75] Inventor: Charaf Hanna, Strasbourg, France

[73] Assignee: Thomson Multimedia SA, Courbevoie, France

[21] Appl. No.: 08/495,548

[22] PCT Filed: Dec. 6, 1994

[86] PCT No.: PCT/FR94/01417

§ 371 Date: Jun. 26, 1996

§ 102(e) Date: Jun. 26, 1996

[87] PCT Pub. No.: WO95/16311

PCT Pub. Date: Jun. 15, 1995

[30] Foreign Application Priority Data

Dec. 7, 1993 [FR] France .................................. 93 14646

[51] Int. Cl.⁶ .................................................. G06F 12/06
[52] U.S. Cl. ........................................................ 711/5
[58] Field of Search ......................................... 711/5, 220

[56] References Cited

U.S. PATENT DOCUMENTS 3,652,998  3/1972  Forney .
5,276,827  1/1994  DeLaruelle et al. .

FOREIGN PATENT DOCUMENTS 0370444  5/1990  European Pat. Off. .
0405673  1/1991  European Pat. Off. .
0467717  1/1992  European Pat. Off. .
3539592  6/1987  Germany .

OTHER PUBLICATIONS

Patent Abstracts of Japan vol. 9, No. 318 JP, A, 60 152 130, Tetsuchi, Itoi, Aug. 1985.
"Realization of Optimum Interleavers", Ramsey, John L. IEEE transactions on Information Theory vol. 16, No. 3, May 1970.
Patent Abstracts of Japan vol. 7, No. 152, JP,A, 58 062 752, Hidehiko, Kobayashi, Apr. 1983.
Patent Abstracts of Japan vol. 17, No. 182, JP, A, 04 335 266, Masaaki Ishibashi, Nov. 1992.

Primary Examiner—Jack A. Lane
Attorney, Agent, or Firm—Joseph S. Tripoli; Peter M. Emanuel; Frederick A. Wein

[57] ABSTRACT

A process for interleaving blocks of P packets each including L binary words, the interleaving being carried out by writing the data to an interleaving memory in a given order and by reading them back in an order corresponding to the interleaving. After having read, at a given address, a data item corresponding to a block b-1, a data item corresponding to the block b is written at the same address.

7 Claims, 4 Drawing Sheets

BLOCK INTERLEAVING AND DEINTERLEAVING METHOD AND DEVICE THEREFOR

BACKGROUND

The present invention relates to a process for blockwise interleaving and deinterleaving of data, as well as to a device implementing this process. The invention applies in particular to the interleaving of digital data before their transmission and to the deinterleaving after reception.

It is known from the prior art to associate the techniques of error detection and correction and interleaving in order to make the transmission of digital data reliable.

For an error correcting code such as the Reed-Solomon code, the packet of binary words to be transmitted is supplemented with a number of extra words, making it possible to correct up to a given maximum number of transmission errors. When this maximum number of errors is exceeded, the correcting code is no longer adequate. This may be the case in particular if a burst of errors corrupts several contiguous words.

In order to increase the effectiveness of the correcting code, several data packets are interleaved. This technique consists in transmitting in succession words arising from different packets. By not transmitting each packet in one go, it is possible to spread the consequences of a burst of errors over several packets, and thus to remain within the limits of the correcting code.

The interleaving, at the sending module, is generally carried out by writing the data to a memory in a certain order, and by reading them back in a different order for transmission. The deinterleaving, at the receiver, is carried out in the inverse manner, by writing the data to the deinterleaving memory in accordance with the order for reading the interleaving memory, and by reading the data back in accordance with the order for writing to the interleaving memory.

Consider P packets to be interleaved, each comprising L bytes. These P packets constitute a block B. An interleaving of depth P is said to be carried out by rearranging the bytes of the P packets in such a way as to separate two successive bytes of a given packet by P-1 bytes arising from the P-1 other packets.

FIG. 1 shows a memory making it possible to carry out this interleaving. In order to simplify the account of the prior art, this memory includes P columns of bytes. The addresses increase from left to right and from top to bottom, as FIG. 1 shows.

This memory is written to by writing the first byte of the first packet at the address 0, the second byte at the address P, and so on until the last byte (byte L-1) at the address (L-1)P. These addresses correspond to the first column of the memory. In the same way, the second packet will be written at the addresses 1, P+1, . . . (L-1)P+1 of the second column. We continue thus up to the last packet and the last column. The order of writing is illustrated in FIG. 2.

By generalizing, it may be stated that byte 1 (with 1 $\in$ [1,L]) of packet p (with p $\in$ [1,P]) of block b (with b $\in$ [1,B]) will be written at the address (b-1)LP+(p-1)+(l-1)P of the memory.

Reading will be performed in the order of the addresses, that is to say by reading row after row (see FIG. 3). Hence, the first bytes of all the packets are read initially, followed by the second bytes and so on. Interlacing is therefore achieved.

This write/read scheme implies that it is necessary to write a large part of the data of a block B before being able to read it. Specifically, E=(L-1) (P-1)+1 bytes will have to have been written before reading the first byte at the address 0. If this criterion is not complied with, reading will occur at some time or another at an address which has not yet been swept by the writing.

FIG. 4 illustrates the progress of the write address and read address in the case where P is taken equal to 3 and L is taken equal to 7. Time is represented as abscissae, whilst the addresses of the interleaving memory form the ordinates. T represents an elementary clock cycle. It will be assumed that for a given cycle, writing is performed before reading.

SUMMARY OF THE INVENTION

Thereby, when the write address is equal to the read address for the same cycle T, the corresponding data item is written first before being read back during the same cycle T.

The sawtooth curve 1 represents the write addresses, whilst the staircase curve 2 represents the read addresses. The curve 1 makes 6 jumps of 3 addresses starting from the address 0, this corresponding to the writing of the first packet (7 bytes) in the first column. Writing then resumes at the top of the second column, with the address 1. At the point A, that is to say after writing (L-1) (P-1)+1=13 bytes, reading can begin at the address 0, during the same cycle in which the writing of the thirteenth byte is performed. The read address will be incremented by one unit in each clock cycle. It will be noted that at the point D the two curves meet. If the reading of the data had been undertaken earlier than the 13$^{th}$ write cycle, for example in the 12$^{th}$ cycle, there would have been an attempt to read at the address 2 before a data item had even been written there.

At point B, the writing of the first block of P packets is complete, the last value having been written at the address (LP-1)=20. The writing of the next block then begins at the address LP=21, as illustrated in FIG. 2. At the end of the block, the address jump is therefore 1.

The minimum size Delta of the memory is equal to the maximum difference between the write address and the read address. In the scheme of FIG. 4, it may be seen that this difference is a maximum at the point C. The write address is LP+(L-1)P. At this moment LP+L bytes have been written. The read address is then LP+L−E=LP+L−(LP−L−P+2)=2L+P-2.

We therefore obtain Delta=LP+(L-1)P−(2L+P-2)+1=2(L-1)(P-1)+1.

Considering the above numerical example, the minimum size of the memory would have been 25 bytes.

The purpose of the invention is to present an interleaving process making it possible to reduce the size of the memories required, whilst simplifying the addressing of these memories.

The subject of the invention is a process for interleaving blocks of P packets each including L binary words, according to which, after having read at a given address a data item corresponding to a block b-1, a data item corresponding to the block b is written at the same address, the said process being characterized in that the addresses of the interleaving memory ranging from 0 to LP-1, the progression of the read/write addresses for a block b is such that:

$$a_b(n)=(a_b(n-1)+(L^{(b-x)}))\mod(LP-1) \text{ for } n\in(0,LP-1), n \text{ integer,}$$

with $$a_b(0)=1$$

$$a_b(LF-1)=LP-1$$

and $$b\in[1,\infty[, b \text{ integer}$$

$$x\leq b, x \text{ integer.}$$

The subject of the invention is also a process for interleaving blocks of P packets each including L binary words, according to which, after having read at a given address a data item corresponding to a block b-1, a data item corresponding to the block b is written at the same address, the said process being characterized in that if $a_b(n)$ is the string of read/write addresses in the interleaving memory whose addresses range from 0 to LP-1, the relation between the string of addresses of block b and the string of addresses of block b+1 is:

$$a_{b+1}(n)=LX(a_b(n)) \text{ modulo } (LP-1) \text{ if } n\neq LP-1,$$

$$a_{b+1}(LP-1)=LP-1.$$

Thus, the memory is filled up by writing the next block in tandem with the reading of the previous block. Owing to the equality, at any moment, of the read and write addresses, the addressing of the interleaving memory is greatly simplified. The size of the memory required is then only PL binary words.

In the first case, the progression of the addresses for a block b does not require a knowledge of the addresses relating to block b-1. It suffices to know L, P, b and x.

In the second case, the relation gives the information required to go from the addresses corresponding to a block b to those corresponding to the block b+1. It suffices to know the addresses corresponding to block b, and the values of L and P.

Obviously, it is possible to go from a block b to a block b+m by applying this relation m times.

According to a particular embodiment of the invention, there is no reading of data during the writing of the data of the first block. The data which could be read at this moment do not normally have any meaning.

According to a particular embodiment of the invention, there is reading of data during the writing of the first block, and the results of this reading are not used. There is then no exception as regards the processing of the first block.

The subject of the invention is also a device for generating addresses for interleaving and/or deinterleaving blocks of P packets, each packet including L binary words, characterized in that it comprises means of generating, for a block of order b, a constant $L^{(b-x)}$ modulo (LP-1) with b an integer and x a constant integer less than or equal to b, and means of adding a multiple times m (an integer varying from 0 to LP-1) of the said constant to a base address, each resulting value being taken modulo (LP-1) if the said value is different from (LP-1) or strictly greater than (LP-1), the result of this addition constituting the read address for block b and the write address for block b+1.

According to a particular embodiment, the device for generating addresses is characterized in that it receives a clock pulse at the frequency of the bytes to be interleaved, the device including a clock divider by P receiving the clock pulse CO, a clock divider by L, receiving as input the output from the divider by P, two adders modulo (LP-1), the second adder performing the modulo calculation only if the result of its addition is either different from or strictly greater than (LP-1), as well as a buffer register, the first adder possessing a clock input receiving the output signal from the divider by P, the two inputs of this first adder respectively receiving the output from the same adder and the output from the buffer register, the adder finally possessing a reset input, controlled by the signal from the divider by L or an initialization signal, the output of the first adder being moreover connected to the input of the said buffer register, the latter also possessing a SET input, connected to the initialization signal and enabling it to be set to the value 1, as well as a clock input connected to the signal from the divider by L, the output of the buffer register being connected to one input of each of the two adders, the second adder receiving on its other input its own output, which also constitutes the output of the device and provides the read/write addresses, the clock input of the second adder being connected to the signal CO, the reset input of the second adder being connected to a logic OR with two inputs, which receives the output from the divider by L and the initialization signal

BRIEF DESCRIPTION OF THE DRAWINGS

Other advantages and characteristics of the invention will emerge through the description of a particular embodiment of the invention, illustrated by the attached figures, in which.

DETAILED DESCRIPTION OF THE PREFERRED EMBODIMENTS

According to the present embodiment of the invention, it is sought to carry out the interleaving, of depth P, of groups of P packets of L bytes in blocks B of PL bytes each. In accordance with the invention, an interleaving memory of PL bytes will be used. To simplify the explanations, this memory [lacuna] organized as a matrix of P columns of L bytes, the memory spaces being addressed from 0 to PL-1 by sweeping the memory row by row, from top left to bottom right.

Figure 5:
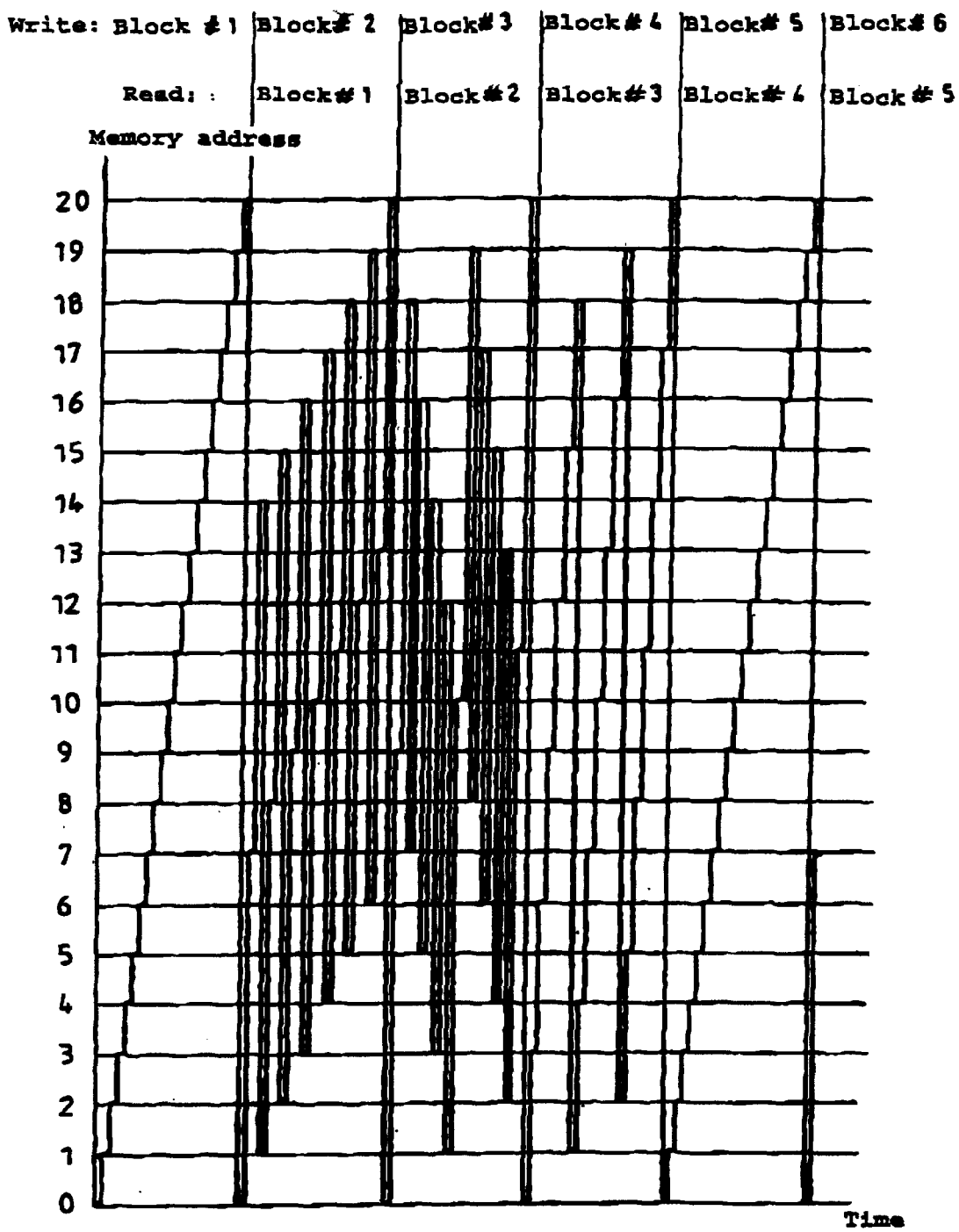
FIG. 5 represents a diagram of progress of the write and read addresses in another interleaving memory, the said progress being in accord with an example of implementation of the inventive method.

FIG. 5 gives the progress of the write and read addresses in accordance with the present embodiment example. P and L are taken equal to 3 and 7 respectively. The memory therefore includes 21 slots, with addresses 0 to 20, given as ordinate. The time appears as abscissa.

The first step to be undertaken consists in writing the first block (block b=1). No reading is performed for this first block. To take a simple example of the progression of the write addresses of this first block, an incrementation by one address with each data write is chosen, starting from the address 0.

The diagram of the progress of the write addresses of the first block is given in the first column of FIG. 5.

The second step consists in reading the data written during the write period for the previous block, in an order corresponding to the interleaving. The read addresses are calculated from the write addresses of the first block. In the present example, the addresses coincide with the order of writing. If the P packets are written consecutively to the memory, the bytes will have to be read every L addresses, starting from the address 0 (the first bytes of the P packets are read initially, and then the second bytes etc.). The function giving the addresses in this case is:

f(X)=LX modulo (LP-1) when LX≠LP-1 f(X)=LP-1 when LX=LP-1 with X varying from 0 to LP-1.

It will be noted that, when LX is equal to LP-1, the value LP-1 is used rather than the value 0.

In accordance with the invention, when the data of the first block are read, the data corresponding to the second block are written at the read addresses. This writing is performed in the same order as before, that is to say the writing is done packet by packet, starting from the first byte of the first packet. The read/write addresses are obviously chosen so as to carry out the interleaving, and are calculated using the function f.

The read addresses of the second block are defined by applying $f^2$ instead of f, and so on for the succeeding blocks. The following table of read/write addresses is thus obtained:

| 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|
| 0 | 7 | 14 | 1 | 8 | 15 | 2 | 9 | 16 | 3 | 10 | 17 | 4 | 11 | 18 | 5 | 12 | 19 | 6 | 13 | 20 |
| 0 | 9 | 18 | 7 | 16 | 5 | 14 | 3 | 12 | 1 | 10 | 19 | 8 | 17 | 6 | 15 | 4 | 13 | 2 | 11 | 20 |
| 0 | 3 | 6 | 9 | 12 | 15 | 18 | 1 | 4 | 7 | 10 | 13 | 16 | 19 | 2 | 5 | 8 | 11 | 14 | 17 | 20 |
| 0 | 1 | 2 | 3 | 4 | 5 | 6 | 7 | 8 | 9 | 10 | 11 | 12 | 13 | 14 | 15 | 16 | 17 | 18 | 19 | 20 |

The first row corresponds to the write addresses of the first block, the second to the read addresses of the first block and to the write addresses of the second block, and so on. Transferring from one row to the next row in the same column is done by applying the function f.

It will be noted that the first and fifth rows are identical, in the context of the numerical example used. This periodicity can be used to facilitate the calculations of the addresses, or their storage in read only memory.

FIG. 5 gives the graphical equivalent of the above table.

It should be noted that the deinterleaving can be carried out by applying either the inventive process, or any other deinterleaving process, the flow of interleaved data sent by the inventive interleaving device being indistinguishable from the flow created by another interleaving device.

According to a variant of this embodiment, and for the purpose of simplifying the circuits, reading in the manner described is performed also during the writing of the first block. The results of this first read will merely not be taken into account.

Figure 3:
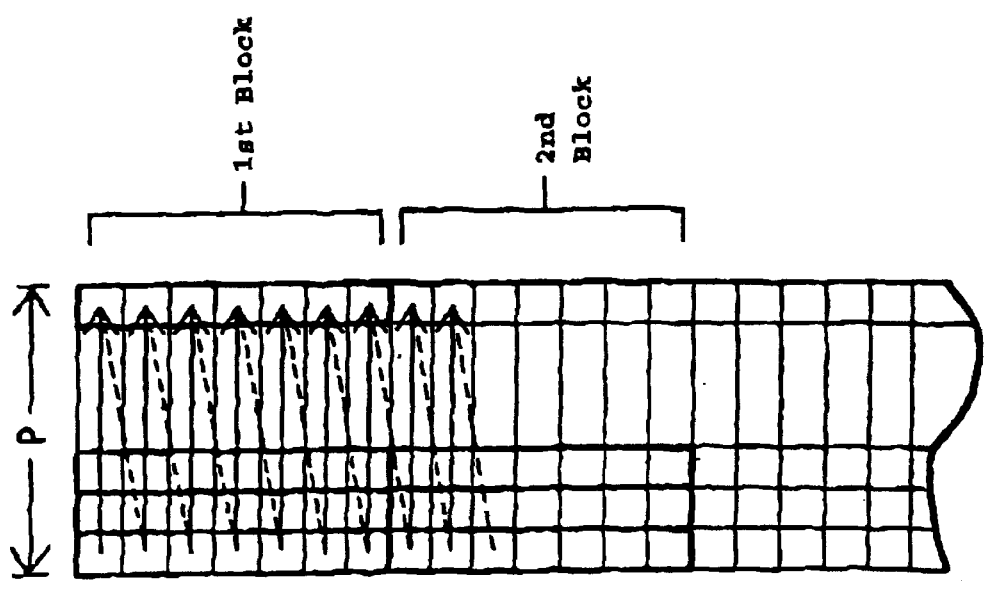
Figure 2:
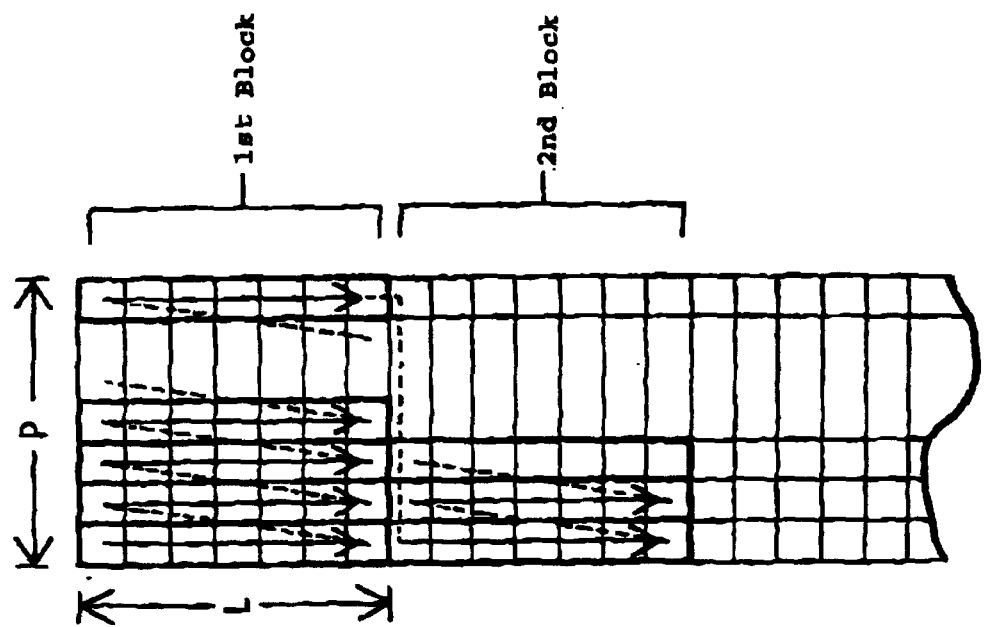
Figure 1:
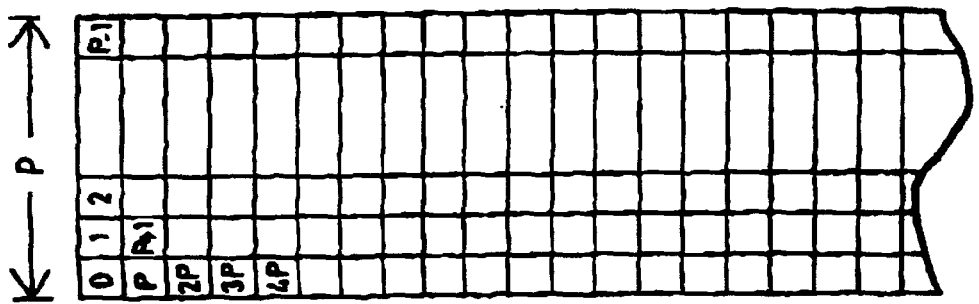
FIG. 1, already described, represents the addressing scheme of an interleaving memory, FIG. 2, already described, represents a known scheme for writing data to the said memory, FIG. 3, already described, represents a scheme for known reading of data from the said memory, FIG. 4, already described, represents a simultaneous diagram of progress of the read and write addresses.
Figure 4:
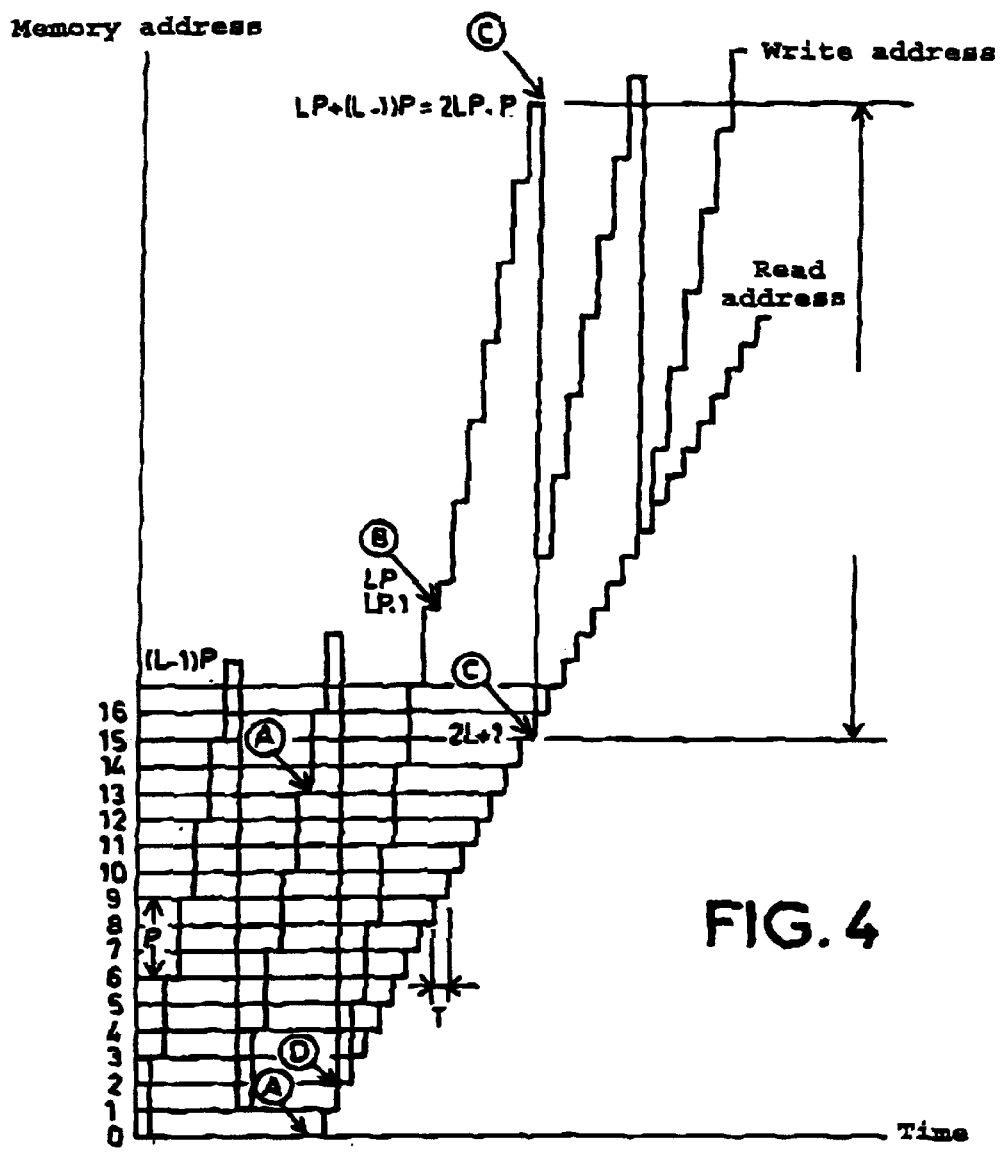
Figure 6:
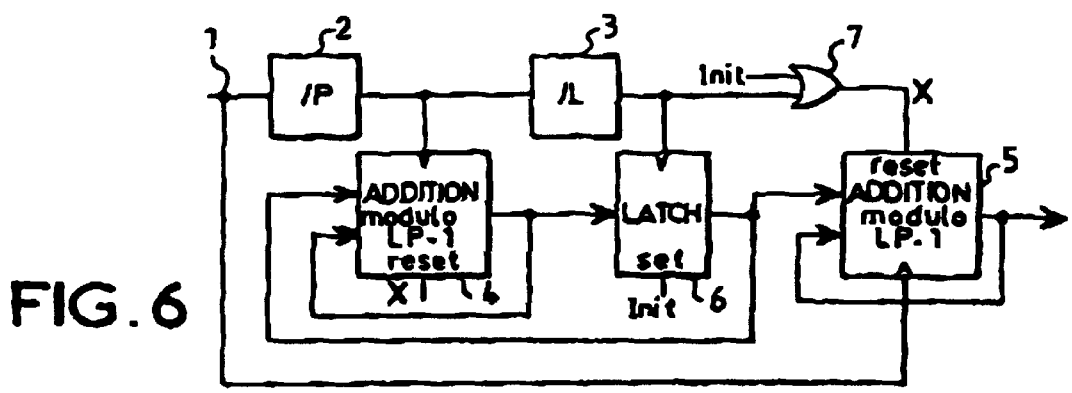
FIG. 6 represents an embodiment example of a device for implementing the invention.

FIG. 6 represents diagrammatically an embodiment example of an address sequencer circuit implementing the invention. The basis of this circuit is the characteristic according to which, for a given block, the transfer from one address to the next is carried out by addition of a constant, the result being taken modulo the size of the memory minus 1 in the case in which this result exceeds the maximum address of the memory. For example, for the first row of the above table, the constant is 1, for the second row it is 7 (7 being less than or equal to 20, the maximum address), for the third it is 9 ($7^2$ modulo 20), for the fourth it is 3 ($7^3$ modulo 20). For the last row we return to a constant 1 (7 to the power 4 modulo 20). The powers correspond to the powers of the function f.

The circuit of FIG. 6 includes an input 1 receiving a clock signal (CO) at the frequency of the bytes to be interleaved, a clock divider by P (2) receiving the clock pulse CO, as well as a clock divider by L (3), receiving as input the output from the divider by P (2).

Three clocks are therefore available, giving one pulse respectively every byte, every P bytes and every block (of PL bytes).

The sequencer circuit moreover includes two adders modulo (LP-1) 4 and 5, as well as a buffer register (or "latch") 6. The role of the first adder 4 is to calculate the constant mentioned above, the latter changing every PL bytes. The latch 6 stores this value, which is used by the second adder 5 to calculate the read-/write addresses proper.

The adder 4 possesses a clock input receiving the output signal from the divider by P 2. The two inputs of this adder respectively receive the output from the same adder 4 and the output from the buffer register 6. The adder 4 finally possesses an initialization input RESET, which allows resetting and which is controlled by the signal from the divider by L 3 or by the initialization signal INIT.

The output of the adder 4 is connected to the input of the buffer register 6. The latter also possesses a SET input, connected to an initialization signal INIT and enabling it to be set to the value 1, as well as a clock input, connected to the signal from the divider by L 3. The output of the buffer register 6 is connected to one input of each of the adders 4 and 6.

The adder 5 receives on its other input its own output, which also constitutes the output of the sequencer circuit and provides the read/write addresses. Its clock input is connected to the signal CO. The RESET input of the adder is connected to a logic OR 7 with two inputs, which receive the output from the divider by L 3 and to the initialization signal INIT.

The operation of the sequencer circuit is as follows: an INIT pulse is sent to the inputs mentioned above. The outputs of the two adders are then at zero, whilst the output of the buffer register is at 1. The output of the circuit therefore indicates the address 0.

For one cycle of the clock CO, the reading of the data item of the previous block is firstly carried out at the address indicated by the output of the circuit, and then the writing of the data item of the present block is carried out at this same address of the memory. Care should be taken that the address at the output of the sequencer circuit remains steady during the read/write cycles, since the result of the addition constituting the address of the next byte should only appear once these cycles have terminated. A buffer register (not illustrated) receiving the output from the sequencer circuit and controlled by a clock derived from CO will for example be used.

The first pulse on C), announcing via its rising edge the steadiness of the first byte to be written on the data bus of the interleaving memory, operates the adder 5 which adds up the values present at its inputs. In the present case, a 1 appears at the output, after the rising edge of the first pulse on CO. Likewise with each of the succeeding pulses on CO. The adder 5 is therefore incremented from 0 up to LP-1, after which value it is reset by the divider by L 3. The addresses therefore progress in the manner indicated in FIG. 5 for block 1.

Meanwhile, the adder 4 counts one pulse of CO every P pulses, its input connected to the register 6 being equal to 1. After LP pulses on CO, the output from the adder exhibits the value L, stored by the buffer register 6 which is operated by the pulse from the divider by L 3 at this time. Care should be taken that the value L at the output of the adder 4 is steady before transferral to the buffer register 6.

For the writing of the second block (and the reading of the first), the progression of the addresses will occur from L into L memory locations, as indicated by the value stored by the buffer register 6. It is here that the modulo function of the adder 5 comes into play, so that the addresses never exceed the maximum address of the memory.

Meanwhile, the adder 4, previously reset, adds L, doing so L times, obtaining $L^2$ modulo LP-1. The modulo is taken after each addition, thus reducing the size of the accumulator register of the adder. Finally, the value $L^2$ mod LP-1 is stored in the buffer register 6.

The operation is then identical for all the succeeding blocks.

According to the example taken, the buffer register 6 is initialized to 1. It is of course possible, according to other embodiments, to initialize it to another of the values $L^2$ mod LP-1, $L^3$ mod LP-1 or L to the power 4 mod LP-1.

The modulo calculation part of the adders 5 is such that the modulo comes into play only when the result of the addition is strictly greater than LP-1. In fact, given the conventions adopted for addressing the interleaving memory, the address LP-1 would never be obtained if this precaution were not taken.

This is equivalent to saying that the modulo is brought into play only when the result is different from LP-1, given that for values which are strictly less, the modulo does not change the result of the addition.

A comparator of known type will for example be used to compare the result of the addition with LP-1. In the case in which the comparison shows that the result of the addition is equal to LP-1, or according to a variant, that it is less than or equal, this result is used directly, without its modulo being taken. The embodying of such a circuit is within the scope of these skilled in the art.

Thus, an address generating device and a clock pulse CO at the frequency of the bytes are available. According to an example embodiment, not illustrated, a clock pulse at the frequency 2×CO is available as is a frequency divider by two creating the clock pulse CO, this double clock pulse being used firstly to read the data item at the address indicated by the generator device, and then to write the data item of the next block at this same address. The circuits for interfacing with the memory as well as the data buses are easily adaptable by those skilled in the art.

Although in the present particular embodiment, the data are represented in the form of bytes, other formats are obviously possible. Moreover, the particular embodiment above carries out interleaving consisting in choosing one byte in turn from each packet. The invention is easily adaptable to other forms of interleaving.

Figure 7:
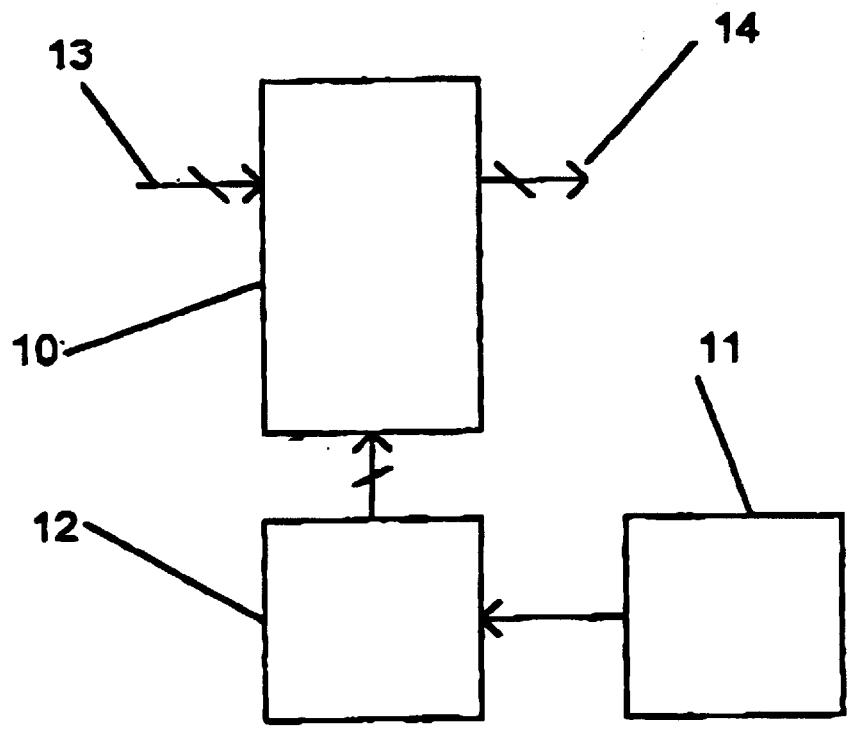
FIGS. 7 and 8 represent other embodiment examples of devices implementing the invention.

FIG. 7 illustrates another embodiment example of a device implementing the invention. According to this example, the device includes a microprocessor 11, a read only memory 12 and the interleaving memory 10. The read only memory includes an integer period of possible address sequences for addressing the memory. These are for example the addresses corresponding to the first four rows of the table given above. The microprocessor 11 addresses the memory 12. For the reading and writing of each block, the memory 12 provides the necessary address to the address bus of the interleaving memory 10. The references 13 and 14 indicate respectively the data bus entering and leaving the memory 10.

As may be seen, the device is very simple. The addresses are pre-stored in a read only memory. The advantage of this device is among other things the fact that few means of calculation are required for addressing.

According to a variant embodiment of this device, the microprocessor 11 is replaced by a simple counter.

Figure 8:
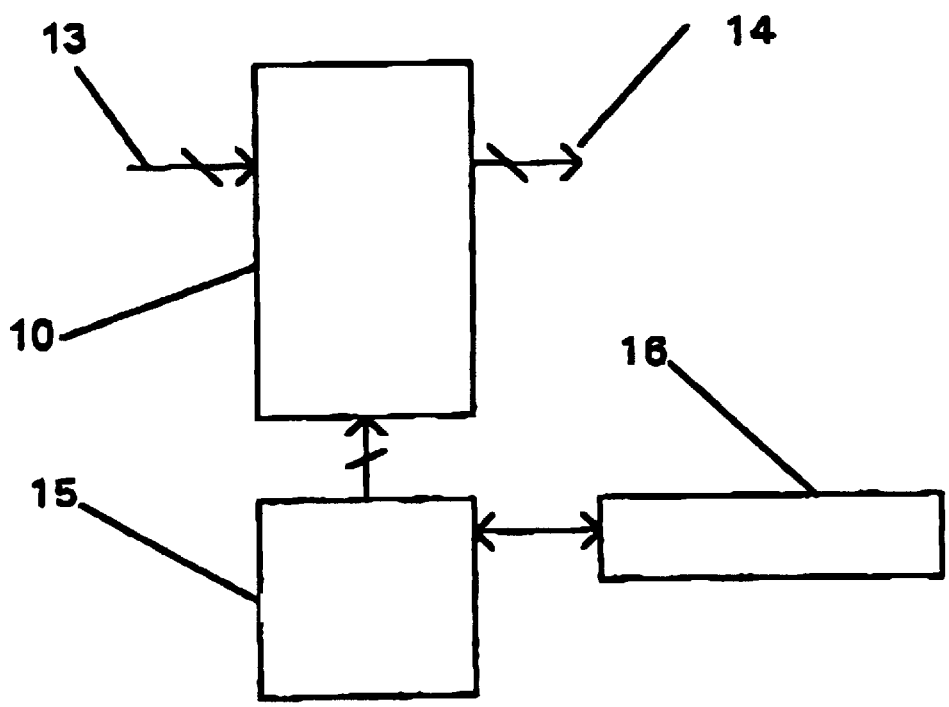

FIG. 8 illustrates another embodiment example of a device in accordance with the invention. The device still includes the interleaving memory 10. It also includes a memory 15, as well as a means of calculation such as a microprocessor 16. The memory contains the constants making it possible, for the writing of a given block, to go from one address to the next address. Again taking the example of L=7, P=3, these constants are, as mentioned earlier: 1, 7, 9 and 3. The microprocessor 16 reads these constants cyclically as required. It performs the necessary additions and the associated modulo calculation. It then addresses the memory 10.

I claim:

1. Process for interleaving blocks of P packets each including L binary words, according to which, after having read at a given address a data item corresponding to a block b-1, a data item corresponding to the block b is written at the same address, wherein the addresses of the interleaving memory range from 0 to LP-1 and the progression of the read/write addresses for a block b is such that:

$a_b(n)=(a_b(n-1)+(L^{(b-x)}))\mod(LP-1)$ for n∈(0,LP-1), n integer, with $a_b(0)=0$ $a_b(LP-1)=LP-1$ and b∈(1∞), b integer $x \leq b$, x integer.

2. Process according to claim 1, wherein the string of constants $L^{(b-x)}$ is stored beforehand.

3. Process for interleaving blocks of P packets each including L binary words, according to which, after having read at a given address a data item corresponding to a block b-1, a data item corresponding to the block b is written at the same address, wherein if $a_b(n)$ is the string of read/write addresses in the interleaving memory whose addresses range from 0 to LP-1, the relation between the string of addresses of block b and the string of addresses of block b+1 is:

$a_{b+1}(n)=Lx(a_b(n))$ modulo (LP-1) if n≠LP-1, $a_{b+1}(LP-1)=LP-1$.

4. Process according to claim 1, wherein there is no reading of data during the writing of the data of the first block.

5. Process according to claim 1, wherein the string of write addresses of the first block is 0; . . . ; LP-1.

6. Device for generating addresses for interleaving and/or deinterleaving blocks of P packets, each packet including L binary words, comprising means for generating, for a block of order b, a constant $L^{(b-x)}$ modulo (LP-1) with b an integer and x a constant integer less than or equal to b, and means for adding a multiple times m (an integer varying from 0 to LP-1) of said constant to a base address, each resulting value being taken modulo (LP-1) if said value is is greater than (LP-1), the result of this addition comprises the read address for block b and the write address for block b+1.

7. Device for generating addresses according to claim 6, wherein the device receives a clock pulse at the frequency of the bytes to be interleaved, the device includes a clock divider by P(2) receiving the clock pulse, a clock divider by L(3), receiving as an input the output from the divider by P(2), two adders modulo (LP-1), one of the adders performing the modulo calculation if the result of its addition is is greater than (LP-1), as well as a buffer register, the first adder possessing a clock input receiving an output signal from the divider by P(2), two inputs of this first adder respectively receiving an output from the same adder and an output from a buffer register, the first adder possessing a reset input controlled by a signal from the divider by L(3) or an initialization signal, the output of the first adder being coupled to the input of said buffer register (6), the latter also possessing a SET input, connected to the initialization signal, and enabling it to be set to a predetermined value, as well as a clock input connected to the signal from the divider by L(3), the output of the buffer register being connected to one input of each of the two adders, the second adder receiving at another input its own output, which further comprises the output of the device and provides read/write addresses, the clock input of the second adder being connected to the signal, the reset input of the second adder being connected to a logic OR with two inputs, which receive the output from the divider by L(3) and the initialization signal.

* * * * *